United States Patent
Vu

(10) Patent No.: US 9,787,309 B2
(45) Date of Patent: Oct. 10, 2017

(54) METHODS FOR PREVENTING REVERSE CONDUCTION

(71) Applicant: Vishay-Siliconix, Santa Clara, CA (US)

(72) Inventor: Trang Vu, Cupertino, CA (US)

(73) Assignee: Vishay-Siliconix, Santa Clara, CA (US)

( * ) Notice: Subject to any disclaimer, the term of this patent is extended or adjusted under 35 U.S.C. 154(b) by 0 days.

(21) Appl. No.: 14/486,926

(22) Filed: Sep. 15, 2014

(65) Prior Publication Data

US 2015/0002192 A1  Jan. 1, 2015

Related U.S. Application Data

(62) Division of application No. 13/565,672, filed on Aug. 2, 2012, now Pat. No. 8,836,404.

(51) Int. Cl.
*H03K 19/0175* (2006.01)
*H03K 5/08* (2006.01)
*H03K 19/003* (2006.01)

(52) U.S. Cl.
CPC .......... *H03K 19/017509* (2013.01); *H03K 19/00315* (2013.01)

(58) Field of Classification Search
CPC .............. H03K 19/00315; H03K 19/017509
USPC ..................... 327/312, 318; 361/56, 91.2
See application file for complete search history.

(56) References Cited

U.S. PATENT DOCUMENTS

| | | | |
|---|---|---|---|
| 5,151,619 A | 9/1992 | Austin et al. | |
| 5,543,733 A * | 8/1996 | Mattos | H03K 19/00315 326/68 |
| 5,614,881 A | 3/1997 | Duggal et al. | |
| 5,635,861 A | 6/1997 | Chan et al. | |
| 5,841,649 A | 11/1998 | Willett et al. | |
| 5,867,356 A | 2/1999 | Duggal et al. | |
| 5,872,460 A | 2/1999 | Bennett et al. | |
| 5,877,646 A | 3/1999 | Jorg | |
| 5,926,056 A | 7/1999 | Morris et al. | |
| 5,933,027 A | 8/1999 | Morris et al. | |
| 5,952,848 A | 9/1999 | Morris | |
| 5,990,705 A * | 11/1999 | Lim | H03K 19/00315 326/58 |

(Continued)

FOREIGN PATENT DOCUMENTS

| | | |
|---|---|---|
| CN | 1839359 | 9/2006 |
| CN | 101488711 | 7/2009 |

(Continued)

*Primary Examiner* — Kenneth B Wells

(57) ABSTRACT

In one embodiment, a circuit includes a resistance including first and second terminals. The first terminal of the resistance is coupled to ground. The circuit also includes a first switching element including first, second, and third terminals. The first terminal of the first switching element is coupled to an output of an integrated circuit and the second terminal of the first switching element is coupled to a voltage supply of the integrated circuit. Additionally, the circuit includes a second switching element including first, second, and third terminals. The first terminal of the second switching element is coupled to an enable input of the integrated circuit. Furthermore, the second terminal of the second switching element is coupled to the third terminal of the first switching element and to the second terminal of the resistance. Moreover, the third terminal of the second switching element is coupled to the ground.

20 Claims, 6 Drawing Sheets

(56) References Cited

U.S. PATENT DOCUMENTS

| | | | |
|---|---|---|---|
| 6,008,627 | A | 12/1999 | Narita |
| 6,150,843 | A * | 11/2000 | Shiffer ............ H03K 19/00315 326/57 |
| 6,215,435 | B1 | 4/2001 | Parry et al. |
| 6,337,591 | B1 | 1/2002 | Maggiolino |
| 6,552,889 | B1 | 4/2003 | Huang et al. |
| 7,224,155 | B2 | 5/2007 | Bo et al. |
| 7,728,565 | B2 | 6/2010 | Wyatt |
| 7,768,339 | B2 | 8/2010 | Suzuki |
| 8,421,426 | B2 | 4/2013 | La Rosa et al. |
| 8,836,404 | B2 | 9/2014 | Vu |
| 9,438,221 | B2 | 9/2016 | Asam et al. |
| 2006/0290203 | A1 | 12/2006 | Muller |
| 2007/0206338 | A1 | 9/2007 | Ishino |
| 2008/0165465 | A1 | 7/2008 | Rallabandi et al. |
| 2009/0195080 | A1 | 8/2009 | Diab et al. |
| 2010/0052647 | A1 | 3/2010 | Forghani-zadeh et al. |
| 2010/0066336 | A1 | 3/2010 | Araki et al. |
| 2010/0090665 | A1 | 4/2010 | Jian |
| 2010/0244790 | A1 | 9/2010 | La Rosa et al. |
| 2010/0327829 | A1 | 12/2010 | Bucur et al. |
| 2013/0265017 | A1 | 10/2013 | La Rosa et al. |
| 2013/0279057 | A1 | 10/2013 | Terrill et al. |
| 2014/0035657 | A1 | 2/2014 | Vu |

FOREIGN PATENT DOCUMENTS

| | | |
|---|---|---|
| JP | 2000-013991 | 1/2000 |
| JP | 2005198439 | 7/2005 |
| JP | 2008-146576 | 6/2008 |

\* cited by examiner

US 9,787,309 B2

METHODS FOR PREVENTING REVERSE CONDUCTION

CROSS-REFERENCE TO RELATED APPLICATION

This is a divisional application of U.S. patent application Ser. No. 13/565,672, now U.S. Pat. No. 8,836,404, entitled "Circuit for Preventing Reverse Conduction", by Trang VU, filed Aug. 2, 2012, which is hereby incorporated by reference.

BACKGROUND

In load switch applications of an integrated circuit, there are times when an active high enable pin is connected to a voltage supply of the integrated circuit through a resistive divider network instead of typically being driven directly from a logic buffer. However, there is at least one disadvantage associated with this configuration. For example, an integrated circuit having the above described configuration can be unintentionally turned on or activated when a battery pack is connected to an output of the integrated circuit. It is pointed out that the unintentional activation of the integrated circuit is an undesirable and an unacceptable operation of the integrated circuit.

SUMMARY

Various embodiments in accordance with the invention can prevent unintentional activation of an integrated circuit or semiconductor chip.

In one embodiment, a circuit includes a resistance including first and second terminals. The first terminal of the resistance is coupled to ground. The circuit also includes a first switching element including first, second, and third terminals. The first terminal of the first switching element is coupled to an output of an integrated circuit and the second terminal of the first switching element is coupled to a voltage supply of the integrated circuit. Additionally, the circuit includes a second switching element including first, second, and third terminals. The first terminal of the second switching element is coupled to an enable input of the integrated circuit. Furthermore, the second terminal of the second switching element is coupled to the third terminal of the first switching element and to the second terminal of the resistance. Moreover, the third terminal of the second switching element is coupled to the ground.

In another embodiment, a semiconductor chip includes a resistance including first and second terminals. The first terminal of the resistance is coupled to ground. In addition, the circuit includes a first transistor including first, second, and third terminals. The first terminal of the first transistor is coupled to an output of the semiconductor chip and the second terminal of the first transistor is coupled to a voltage supply of the semiconductor chip. Furthermore, the circuit includes a second transistor including first, second, and third terminals. The first terminal of the second transistor is coupled to an enable input of the semiconductor chip. Moreover, the second terminal of the second transistor is coupled to the third terminal of the first transistor and to the second terminal of the resistance. The third terminal of the second transistor is coupled to the ground.

In yet another embodiment, a method can include detecting a defined voltage difference between an output pin and an input voltage supply pin of an integrated circuit. Furthermore, the method can include preventing the integrated circuit from turning on after the detecting.

While particular embodiments in accordance with the invention have been specifically described within this Summary, it is noted that the invention and the claimed subject matter are not limited in any way by these embodiments.

BRIEF DESCRIPTION OF THE DRAWINGS

Within the accompanying drawings, various embodiments in accordance with the invention are illustrated by way of example and not by way of limitation. It is noted that like reference numerals denote similar elements throughout the drawings.

The drawings referred to in this description should not be understood as being drawn to scale except if specifically noted.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details or with equivalents thereof. In other instances, well known methods, procedures, components, and circuits have not been described in detail as not to unnecessarily obscure aspects of the invention.

Figure 1:
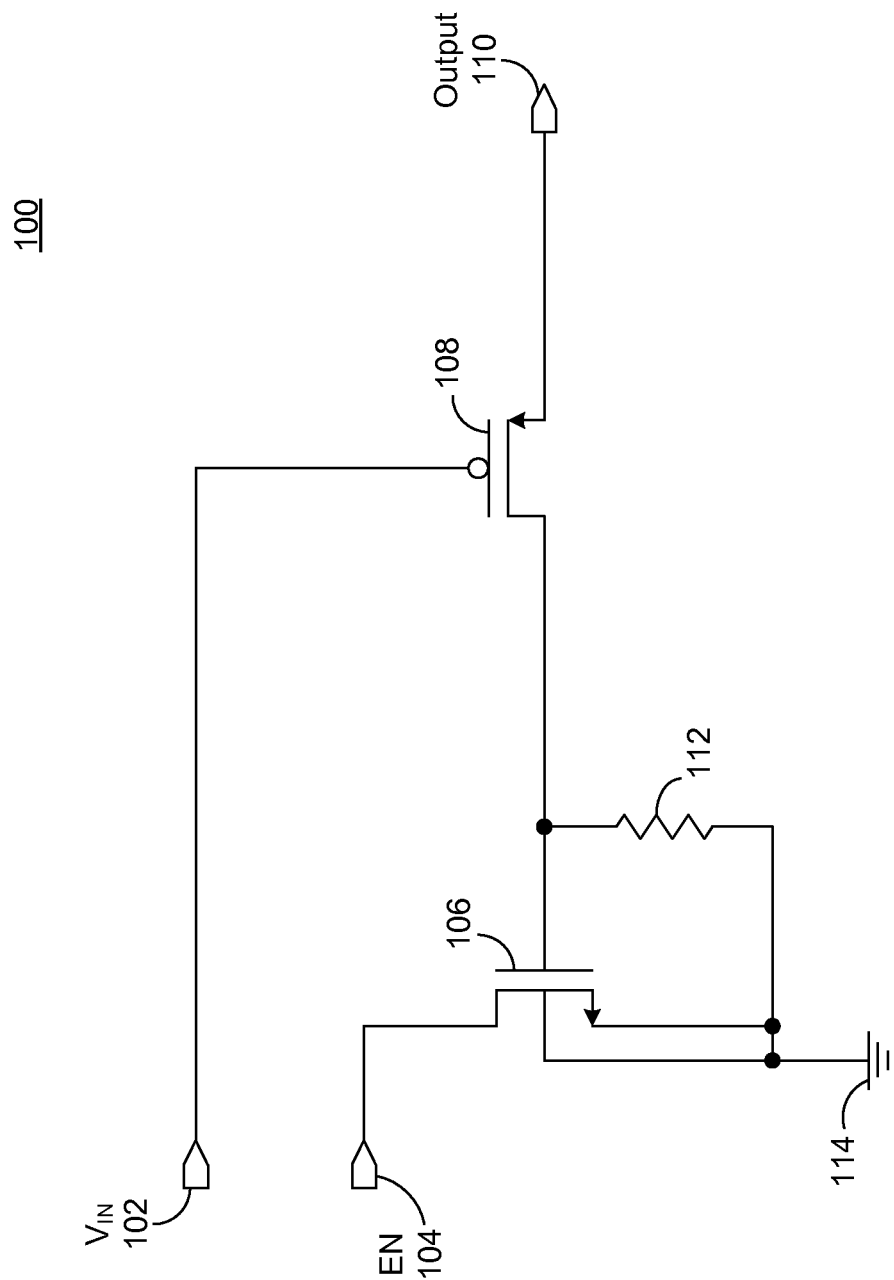
FIG. 1 is a schematic diagram of a control circuit for preventing reverse conduction in a load switch in accordance with various embodiments of the invention.

FIG. 1 is a schematic diagram of a control circuit 100 for preventing reverse conduction in a load switch of an integrated circuit (or chip or semiconductor chip) in accordance with various embodiments of the invention. In one embodiment, the control circuit 100 has the ability to clamp an enable (EN) pin 104 of the integrated circuit to ground 114 thereby turning off or preventing the turning on (or activation) of the load switch (not shown) of the integrated circuit. In addition, note that in an embodiment, when the control circuit 100 clamps the enable pin 104 to the ground 114, the integrated circuit is turned off or prevented from turning on. More specifically, the control circuit 100 can actively pull down the enable pin 104 to ground 114 when the control circuit 100 detects a defined voltage difference between an output pin 110 of the integrated circuit and an input voltage supply pin ($V_{IN}$) 102 of the integrated circuit. In this manner, the control circuit 100 can ensure that the load switch and the integrated circuit remains deactivated or turned off even when a voltage is applied to the output pin 110. Moreover, the control circuit 100 can ensure that the load switch remains turned off even when a voltage is applied to the output pin 110 and there is little or no voltage applied to the input voltage supply pin 102 and the enable pin 104. In addition, note that if the load switch of the integrated circuit has been turned on (e.g., during normal operation), the control circuit 100 can turn off or deactivate the load switch and the integrated circuit when the control circuit 100 detects a defined voltage difference between the output pin 110 of the integrated circuit and the input voltage supply pin 102. Therefore, the control circuit 100 can prevent reverse conduction within the load switch of the integrated circuit.

Within the present embodiment of the control circuit 100, a source of a transistor 108 can be coupled to the output pin 110 of the integrated circuit, its gate can be coupled to the input supply voltage pin 102, and its drain can be coupled to a gate of a pull down transistor 106. In one embodiment, the input supply voltage pin 102 is the voltage supply pin for the entire chip or integrated circuit. The transistor 106 may be referred to as the enable switch 106, but is not limited to such. In addition, a drain of the pull down transistor 106 can be coupled to the enable pin 104 of the integrated circuit. In an embodiment, it is pointed out that a weak pull down resistor 112 at the gate of the transistor 106 can be implemented to ensure that the transistor 106 is turned off or deactivated during normal operation of the integrated circuit. In one embodiment, note that the normal operation of the integrated circuit can take place when one or more voltages are applied or coupled to the input voltage supply pin 102 and the enable pin 104.

Within FIG. 1, in an embodiment, when the output pin 110 of the integrated circuit is a higher voltage than the input voltage supply pin 102 by a threshold voltage (e.g., 0.8 or 1 volt (V)), the transistor 108 can become active which results in activating or turning on the transistor 106. Consequently, the turning on of the transistor 106 results in actively pulling down the enable pin 104 of the integrated circuit to the ground 114. In one embodiment, an effective pull down resistance 112 of the transistor 106 is approximately 150 ohms (Ω), but is not limited to such. It is noted that the resistor (or resistance or impedance) 112 can be implemented in a wide variety of ways. For example, one or more resistors can be coupled in series, parallel, and/or in any configuration to implement resistor 112, but is not limited to such. Note that the transistor 108 may be referred to as the $V_{IN}$ switch 108, but is not limited to such.

In an embodiment of the control circuit 100, it is noted that when a voltage (e.g., via a battery or battery pack) is applied or coupled to the output pin 110 of the integrated circuit, that voltage is also applied to the source of the transistor 108. Additionally, when a voltage is applied or coupled to the input supply voltage pin 102 of the integrated circuit, that voltage is also applied to the gate of the transistor 108. Furthermore, when a voltage is applied or coupled to the enable pin 104 of the integrated circuit, that voltage is also applied to the drain of the transistor 106. Accordingly, if the voltage at the source of the transistor 108 is higher than its threshold voltage (e.g., 0.8 or 1 V) together with the voltage at its gate, the transistor 108 is turned on or activated. Once the transistor 108 is turned on, current can flow from its source to its drain resulting in a voltage being applied to the gate of the transistor 106 and to a first terminal of the resistor 112.

In addition, within FIG. 1, if the voltage at the gate of the transistor 106 is higher than its threshold voltage together with the voltage at its source, the transistor 106 is turned on or activated. Once the transistor 106 is turned on, the enable pin 104 is pulled down or coupled to the ground 114 thereby resulting in the load switch of the integrated circuit remaining turned off or deactivated. In this fashion, the control circuit 100 can prevent the load switch of the integrated circuit from turning on even when a voltage is applied to the output pin 110 and there is little or no voltage applied to the input voltage supply pin 102 and the enable pin 104. In an embodiment, if the load switch and the integrated circuit have been turned on (e.g., during normal operation), once the transistor 106 is turned on as described within this paragraph, the enable pin 104 is pulled down or coupled to the ground 114 thereby turning off or deactivating the load switch and the integrated circuit.

In an embodiment, it is pointed out that when the integrated circuit is properly enabled and driven on via the enable pin 104 and the input voltage supply pin 102, the control circuit 100 does not interfere with the normal operation of the integrated circuit. Note that the integrated circuit that includes the control circuit 100 can also include, in one embodiment, additional circuitry (not shown) that can be coupled to the input supply voltage pin 102, the enable pin 104, and the output pin 110. Consequently, when one or more appropriate voltages are applied or coupled to the input voltage supply pin 102 and the enable pin 104 of the integrated circuit, the additional circuitry can perform one or more operations and functions. Furthermore, when the appropriate voltages are applied to the input voltage supply pin 102 and the enable pin 104, both of the transistors 106 and 108 of the control circuit 100 are turned off or restricted from turning on.

For example, in an embodiment, the transistor 108 of FIG. 1 can be turned off or restricted from turning on in the previously described situation because the voltage applied to the input voltage supply pin 102 will typically be higher than or equal to the voltage at the output pin 110, which can be produced by the additional circuitry of the integrated circuit. Specifically, since the voltage at the gate of the transistor 108 is higher than or equal to the voltage at its source, the transistor 108 is turned off or restricted from turning on. Additionally, since the transistor 108 is turned off and the pull down resistor 112 is coupled to the gate of the transistor 106 and to the ground 114, the transistor 106 will be turned off or restricted from turning on. As such, current does not flow through the transistor 106 even though the voltage applied to the enable pin 104 is also applied to the drain of the transistor 106. In this manner, the control circuit 100 does not interfere with the normal operation of the integrated circuit.

In an embodiment, the control circuit 100 can include the resistor 112 and the transistors 106 and 108, but is not limited to such. More specifically, the drain of the transistor 106 can be coupled to the enable pin 104 of a chip or integrated circuit while the source of the transistor 106 can be coupled to the ground 114 and a first terminal of the resistor 112. Furthermore, the body of the transistor 106 can be coupled to the ground 114, the source of the transistor 106, and the first terminal of the resistor 112. In addition, the gate of the transistor 106 can be coupled to a second terminal of the resistor 112 and the drain of the transistor 108. The gate of the transistor 108 can be coupled to the voltage supply 102 of the chip or integrated circuit while the source of the transistor 108 can be coupled to the output 110 of the chip or integrated circuit.

Within FIG. 1, note that each of transistors 106 and 108 can be implemented in a wide variety of ways. In an embodiment, the transistor 108 can be implemented as, but is not limited to, a P-channel MOSFET (metal-oxide semiconductor field-effect transistor) which is also known as a PMOS. Additionally, in an embodiment, the transistor 106 can be implemented as, but is not limited to, an N-channel MOSFET which is also known as a NMOS. It is noted that each of the transistors 106 and 108 can be referred to as a switching element. In an embodiment, note that a gate, a drain, and a source of the transistors 106 and 108 can each be referred to as a terminal of its transistor. Furthermore, in an embodiment, each gate of the transistors 106 and 108 can also be referred to as a control terminal of its transistor. In an embodiment, the transistor 108 can be implemented as, but is not limited to, a PNP bipolar junction transistor (BJT). Moreover, in an embodiment, the transistor 106 can be implemented as, but is not limited to, a NPN BJT. In an embodiment, it is pointed out that a base, a collector, and an emitter of the transistors 106 and 108 can each be referred to as a terminal of its transistor. In addition, in an embodiment, each base of the transistors 106 and 108 can also be referred to as a control terminal of its transistor.

It is understood that the control circuit 100 may not include all of the elements illustrated by FIG. 1. In addition, the control circuit 100 can be implemented to include one or more elements not illustrated by FIG. 1. It is pointed out that the control circuit 100 can be utilized or implemented in any manner similar to that described herein, but is not limited to such.

Figure 2:
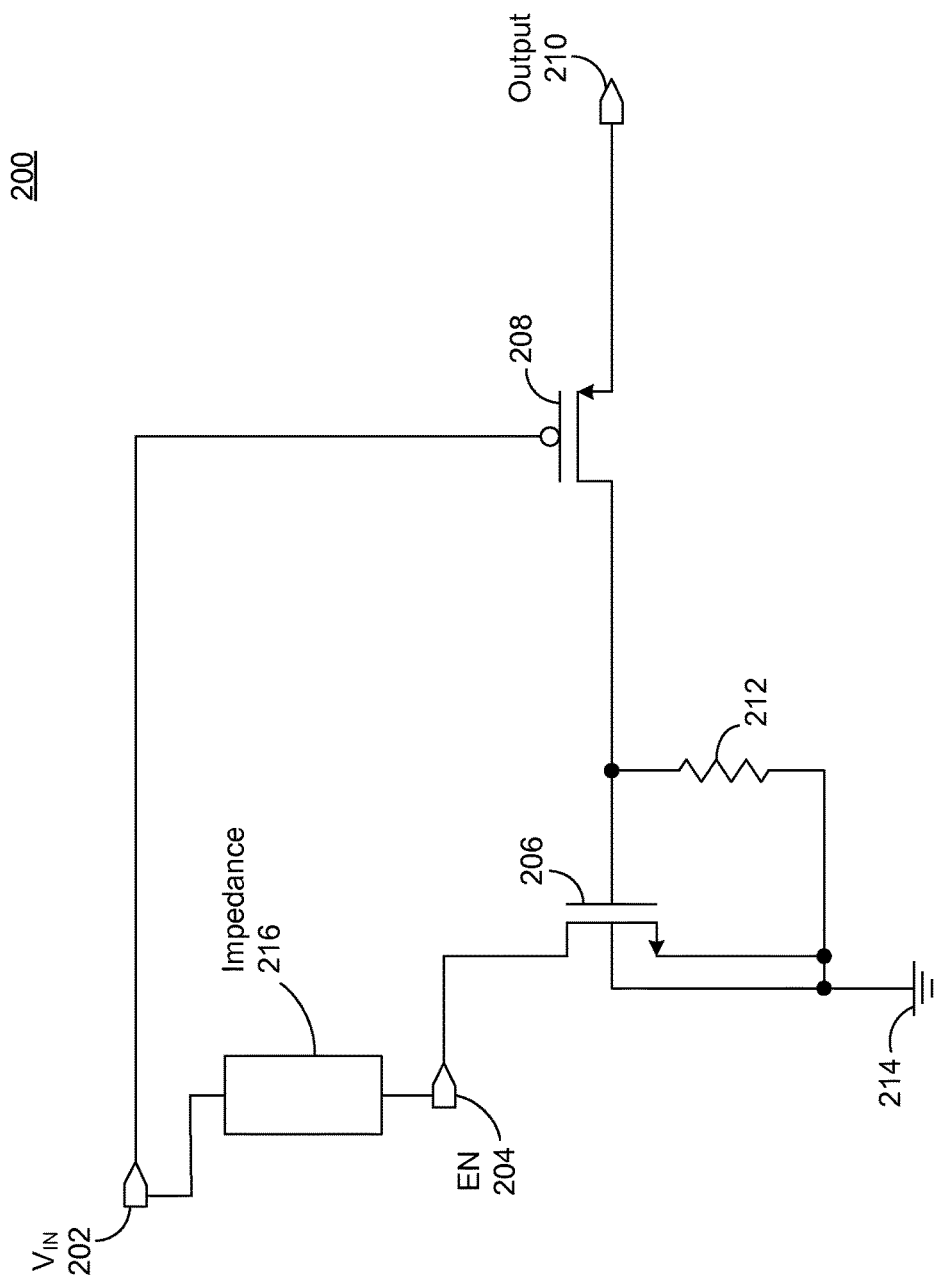
FIG. 2 is another schematic diagram of a control circuit for preventing reverse conduction in a load switch in accordance with various embodiments of the invention.

FIG. 2 is another schematic diagram of a control circuit 200 for preventing reverse conduction in a load switch of an integrated circuit (or chip or semiconductor chip) in accordance with various embodiments of the invention. In an embodiment, the control circuit 200 has the ability to clamp an enable pin 204 of the integrated circuit to ground 214 thereby turning off or preventing the turning on of the load switch (not shown) of the integrated circuit. In addition, it is noted that in an embodiment, when the control circuit 200 clamps the enable pin 204 to the ground 214, the integrated circuit is turned off or prevented from turning on. Specifically, the control circuit 200 can actively pull down the enable pin 204 to the ground 214 when the control circuit 200 detects a defined voltage difference between an output pin 210 of the integrated circuit and an input voltage supply pin 202 of the integrated circuit. In this fashion, the control circuit 200 can ensure that the load switch and the integrated circuit remain turned off even when a voltage is applied to the output pin 210. Additionally, the control circuit 200 can ensure that the load switch remains turned off even when a voltage is applied to the output pin 210 and there is little or no voltage applied to the input voltage supply pin 202 and the enable pin 204. In addition, note that if the load switch of the integrated circuit has been turned on (e.g., during normal operation), the control circuit 200 can turn off or deactivate the load switch and the integrated circuit when the control circuit 200 detects a defined voltage difference between the output pin 210 of the integrated circuit and the input voltage supply pin 202. As such, the control circuit 200 can prevent reverse conduction within the load switch of the integrated circuit.

In an embodiment, a source of a transistor 208 can be coupled to the output pin 210 of the integrated circuit, its gate can be coupled to the input supply voltage pin 202, and its drain can be coupled to a gate of a pull down transistor 206. In one embodiment, the input supply voltage pin 202 can be the voltage supply pin for the entire chip or integrated circuit. Note that the transistor 206 may be referred to as the enable switch 206, but is not limited to such. A drain of the pull down transistor 206 can be coupled to the enable pin 204 of the integrated circuit. In an embodiment, a weak pull down resistor 212 at the gate of the transistor 206 can be implemented to ensure that the transistor 206 is turned off during normal operation of the integrated circuit. In one embodiment, the normal operation of the integrated circuit can occur when a voltage is applied or coupled to the input voltage supply pin 202 resulting in a voltage being applied to the enable pin 204 via an impedance (or resistance) 216.

Within FIG. 2, in one embodiment, the enable pin 204 can be coupled to the input voltage supply input 202 via the impedance 216. It is noted that one of the reasons that the enable pin 204 may be coupled to the input voltage supply input 202 is because there may not be another supply voltage available to drive the enable pin 204. In addition, the impedance 216 can be coupled between the input voltage supply pin 202 and the enable pin 204 because the voltage supply applied to the input voltage supply pin 202 may be too high for the enable pin 204. As such, the impedance 216 can be utilized to reduce or divide the supply voltage down to a proper voltage level for the enable pin 204.

In an embodiment, when the output pin 210 of the integrated circuit is a higher voltage than the input voltage supply pin 202 by a threshold voltage (e.g., 0.8 or 1 V), the transistor 208 can turn on resulting in activating or turning on the transistor 206. Note that the turning on of the transistor 206 results in actively pulling down the enable pin 204 of the integrated circuit to the ground 214. In one embodiment, the effective pull down resistance 212 of the transistor 206 is approximately 150Ω, but is not limited to such. It is pointed out that the resistor (or resistance or impedance) 212 can be implemented in a wide variety of ways. For example, the resistor 212 can be implemented in any manner described herein, but is not limited to such. It is noted that the transistor 208 may be referred to as the $V_{IN}$ switch 208, but is not limited to such.

Within FIG. 2, in an embodiment, when a voltage (e.g., via a battery or battery pack) is applied or coupled to the output pin 210 of the integrated circuit, that voltage is also applied to the source of the transistor 208. Also, when a voltage is applied or coupled to the input supply voltage pin 202 of the integrated circuit, that voltage is also applied to the gate of the transistor 208. In addition, when a voltage is applied or coupled to the enable pin 204 of the integrated circuit, that voltage is also applied to the drain of the transistor 206. Therefore, if the voltage level at the source of the transistor 208 is higher than its threshold voltage (e.g., 0.8 or 1 V) combined with the voltage level at its gate, the transistor 208 is turned on or activated. Once the transistor 208 is turned on, current can flow from its source to its drain resulting in a voltage being applied to the gate of the transistor 206 and to a first terminal of the resistor 212.

Moreover, if the voltage at the gate of the transistor 206 is higher than its threshold voltage together with the voltage at its source, the transistor 206 is turned on or activated. Once the transistor 206 is turned on, the enable pin 204 is pulled down or coupled to the ground 214 thereby resulting in the load switch of the integrated circuit remaining turned off or deactivated. In this manner, the control circuit 200 can prevent the load switch of the integrated circuit from turning on even when a voltage is applied to the output pin 210 and there is little or no voltage applied to the input voltage supply pin 202 and the enable pin 204. In an embodiment, if the load switch and the integrated circuit have been turned on (e.g., during normal operation), once the transistor 206 is turned on as described within this paragraph, the enable pin 204 is pulled down or coupled to the ground 214 thereby turning off or deactivating the load switch and the integrated circuit.

Within FIG. 2, in an embodiment, when the integrated circuit is driven on and enabled via the input voltage supply pin 202 and the enable pin 204, the control circuit 200 does not interfere with the normal operation of the integrated circuit. It is pointed out that the integrated circuit that includes the control circuit 200 can also include, in one embodiment, additional circuitry (not shown) that can be coupled to the input supply voltage pin 202, the enable pin 204, and the output pin 210. Therefore, when a voltage is applied or coupled to the input voltage supply pin 202, a voltage is applied to the enable pin 204 via the impedance 216 thereby enabling the additional circuitry to perform one or more operations and functions. In addition, when the appropriate voltages are applied to the input voltage supply pin 202 and the enable pin 204, both of the transistors 206 and 208 of the control circuit 200 are turned off or restricted from turning on.

For example, in an embodiment, the transistor 208 can be turned off or restricted from turning on in the above described situation because the voltage applied to the input voltage supply pin 202 will typically be higher than or equal to the voltage at the output pin 210, which can be produced by the additional circuitry of the integrated circuit. Since the voltage at the gate of the transistor 208 is higher than or equal to the voltage at its source, the transistor 208 can be turned off or restricted from turning on. Furthermore, since the transistor 208 is turned off and there is the pull down resistor 212 coupled to the gate of the transistor 206 and the ground 214, the transistor 206 will be turned off or restricted from turning on. Therefore, current does not flow through the transistor 206 even though the voltage at the enable pin 204 is also applied to the drain of the transistor 206. In this fashion, the control circuit 200 does not interfere with the normal operation of the integrated circuit.

Within FIG. 2, in an embodiment, the control circuit 200 can include the impedance 216, the resistor 212, and the transistors 206 and 208, but is not limited to such. Specifically, the drain of the transistor 206 can be coupled to a first terminal of the impedance 216 and the enable pin 204 of a chip or integrated circuit while the source of the transistor 206 can be coupled to the ground 214 and a first terminal of the resistor 212. Additionally, the body of the transistor 206 can be coupled to the ground 214, the source of the transistor 206, and the first terminal of the resistor 212. Furthermore, the gate of the transistor 206 can be coupled to a second terminal of the resistor 212 and the drain of the transistor 208. The gate of the transistor 208 can be coupled to a second terminal of the impedance 216 and the voltage supply 202 of the chip or integrated circuit while the source of the transistor 208 can be coupled to the output 210 of the chip or integrated circuit.

Note that each of the transistors 206 and 208 can be implemented in a wide variety of ways. In one embodiment, the transistor 208 can be implemented as, but is not limited to, a P-channel MOSFET which is also known as a PMOS. In addition, in an embodiment, the transistor 206 can be implemented as, but is not limited to, an N-channel MOSFET which is also known as a NMOS. Note that each of the transistors 206 and 208 can be referred to as a switching element. In an embodiment, it is noted that a gate, a drain, and a source of the transistors 206 and 208 can each be referred to as a terminal of its transistor. Moreover, in an embodiment, each gate of the transistors 206 and 208 can also be referred to as a control terminal of its transistor. In an embodiment, the transistor 208 can be implemented as, but is not limited to, a PNP bipolar junction transistor (BJT). Furthermore, in an embodiment, the transistor 206 can be implemented as, but is not limited to, a NPN BJT. In an embodiment, it is pointed out that a base, a collector, and an emitter of the transistors 206 and 208 can each be referred to as a terminal of its transistor. In addition, in an embodiment, each base of the transistors 206 and 208 can also be referred to as a control terminal of its transistor.

It is understood that the control circuit 200 may not include all of the elements illustrated by FIG. 2. Furthermore, the control circuit 200 can be implemented to include one or more elements not illustrated by FIG. 2. It is pointed out that the control circuit 200 can be utilized or implemented in any manner similar to that described herein, but is not limited to such.

Figure 3:
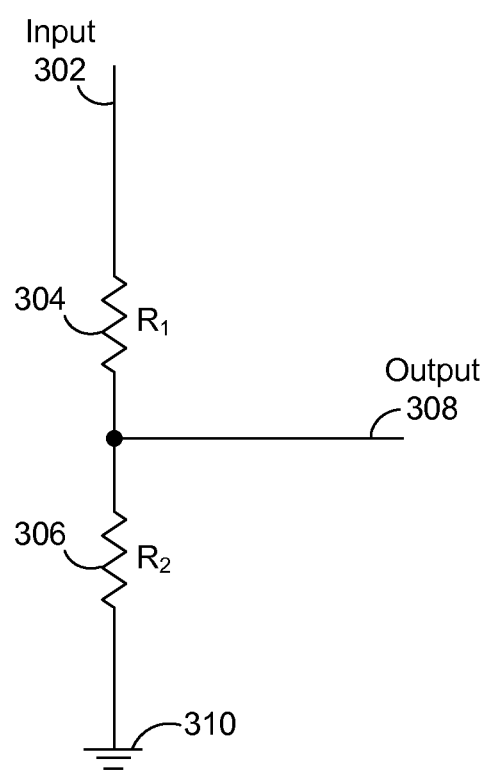
FIG. 3 is a schematic diagram of a resistor divider network that can be utilized in accordance with various embodiments of the invention.

FIG. 3 is a schematic diagram of a resistor divider network 300 that can be utilized in accordance with various embodiments of the invention. It is noted that in various embodiments, the resistor divider network 300 can be utilized for implementing the impedance 216 of the control circuit 200 of FIG. 2, but is not limited to such. As such, the resistor divider network 300 can be utilized to reduce or divide down a supply voltage applied to the input voltage supply pin 202 of the control circuit 200 to a proper or desired voltage level for the enable pin 204. It is pointed out that the resistor divider network 300 can be implemented in a wide variety of resistor divider configurations in accordance with various embodiment of the invention.

The resistor divider network 300 of FIG. 3 can include, but is not limited to, an input terminal 302, a resistor 304, a resistor 306, and an output terminal 308. In an embodiment, the input terminal 302 can be coupled to the input voltage supply pin 202 of the control circuit 200 (FIG. 2) while the output terminal 308 can be coupled to the enable pin 204 of the control circuit 200. It is noted that in an embodiment, the output voltage ($V_{out}$) at the output terminal 308 can be defined by the following relationship:

$$V_{out} = \frac{R_2}{R_1 + R_2} \cdot V_{in}$$

where $V_{in}$ is equal to the input voltage received at the input terminal 302, $R_1$ is equal to the resistance value (ohms) of the resistor 304, and $R_2$ is equal to the resistance value of the resistor 306.

Within FIG. 3, in an embodiment, a first terminal of the resistor 304 of the resistor divider network 300 can be coupled to (or referred to as) the input terminal 302 while a second terminal of the resistor 304 can be coupled to the output terminal 308 and to a first terminal of the resistor 306. Furthermore, a second terminal of the resistor 306 can be coupled to ground 310. It is noted that in various embodiments, the resistor 304 can be implemented with one resistor or multiple resistors coupled in series and/or coupled in parallel. Moreover, the resistor 306 can be implemented with one resistor or multiple resistors coupled in series and/or coupled in parallel.

It is understood that the resistor divider network 300 can be implemented to include one or more elements not illustrated by FIG. 3. It is pointed out that the resistor divider network 300 can be utilized or implemented in any manner similar to that described herein, but is not limited to such.

Figure 4:
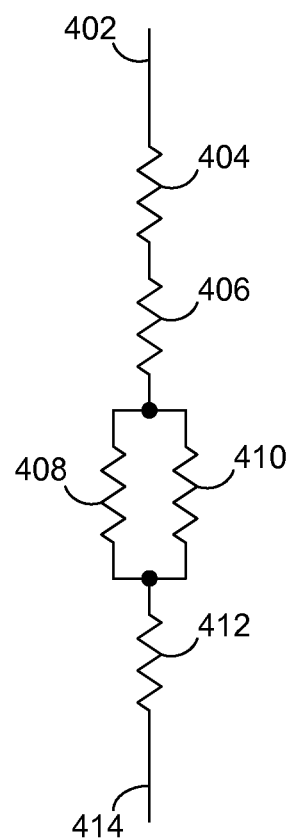
FIG. 4 is a schematic diagram of a resistor network that can be utilized in accordance with various embodiments of the invention.

FIG. 4 is a schematic diagram of a resistor network 400 that can be utilized in accordance with various embodiments of the invention. In various embodiments, the resistor network 400 can be utilized for implementing the impedance 216 of the control circuit 200 of FIG. 2, but is not limited to such. Therefore, the resistor network 400 can be utilized to reduce a supply voltage applied to the input voltage supply pin 202 of the control circuit 200 to a proper or desired voltage level for the enable pin 204. Note that the resistor network 400 can be implemented in a wide variety of resistor configurations in accordance with various embodiment of the invention.

In one embodiment, the resistor network 400 can include, but is not limited to, terminals 402 and 414 along with resistors 404, 406, 408, 410, and 412. In an embodiment, the terminal 402 can be coupled to the input voltage supply pin 202 of the control circuit 200 (FIG. 2) while the terminal 414 can be coupled to the enable pin 204 of the control circuit 200. In another embodiment, the terminal 402 can be coupled to the enable pin 204 of the control circuit 200 while the terminal 414 can be coupled to the input voltage supply pin 202 of the control circuit 200. Within the present embodiment, it is pointed out that the resistor 404 is coupled in series with the resistor 406. In addition, it is noted that the resistor 408 is coupled in parallel with the resistor 410.

Within FIG. 4, in an embodiment, a first terminal of the resistor 404 of the resistor network 400 can be coupled to (or referred to as) the terminal 402 while a second terminal of the resistor 404 can be coupled to a first terminal of the resistor 406. Additionally, a second terminal of the resistor 406 can be coupled to a first terminal of the resistor 408 and to a first terminal of the resistor 410. A second terminal of the resistor 408 can be coupled to a second terminal of the resistor 410 and to a first terminal of the resistor 412. Moreover, a second terminal of the resistor 412 can be coupled to (or referred to as) the terminal 414.

It is understood that the resistor network 400 may not include all of the elements illustrated by FIG. 4. For example, in an embodiment, the resistor network 400 can include a single resistor or resistance or impedance. The resistor network 400 can be implemented to include one or more elements not illustrated by FIG. 4. It is pointed out that the resistor network 400 can be utilized or implemented in any manner similar to that described herein, but is not limited to such.

Figure 5:
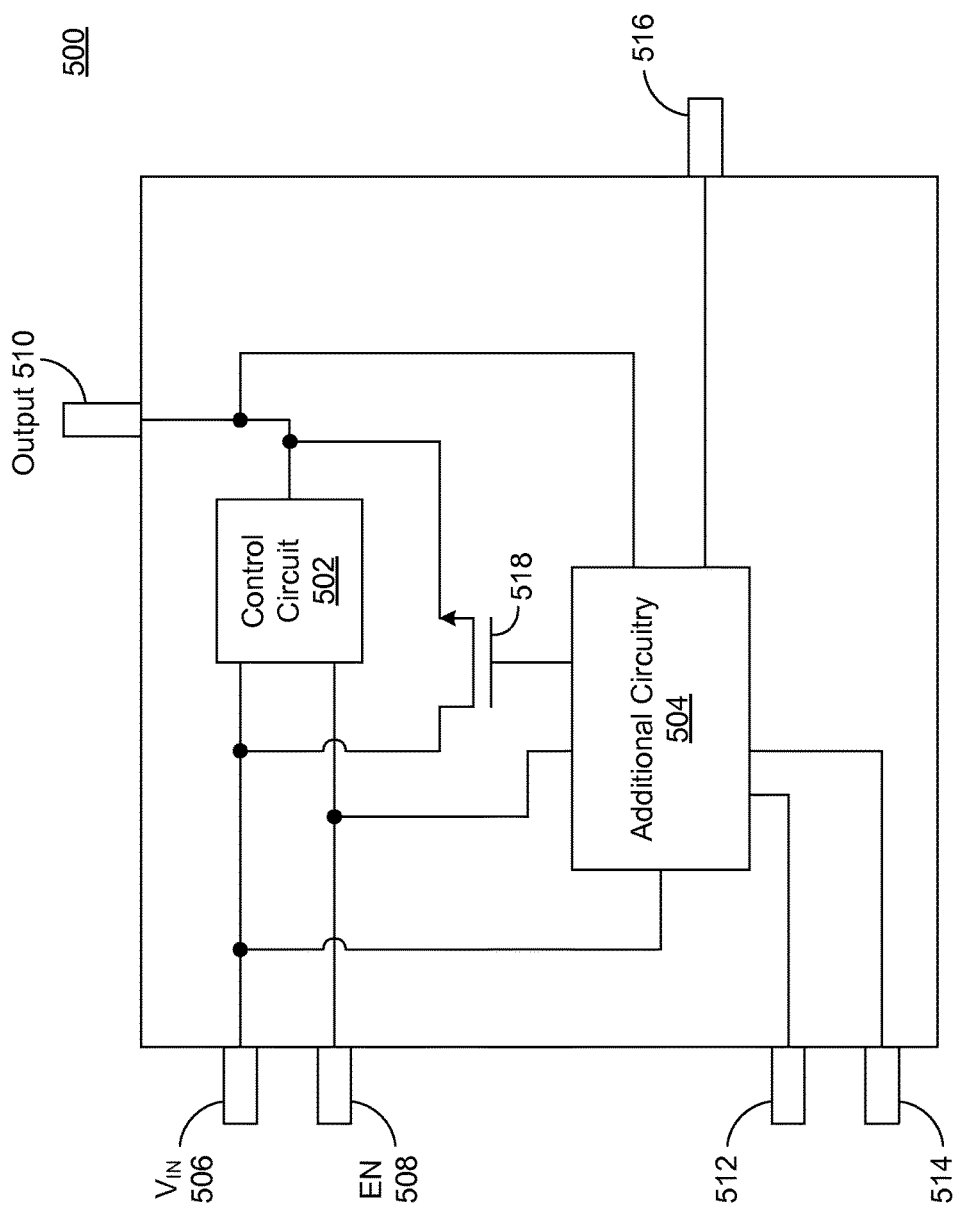
FIG. 5 is a block diagram of an integrated circuit in accordance with various embodiments of the invention.

FIG. 5 is a block diagram of an integrated circuit (or chip or semiconductor chip) 500 in accordance with various embodiments of the invention. In an embodiment, the integrated circuit 500 can include a control circuit 502, additional circuitry 504, and a load switch 518, but is not limited to such. Note that in various embodiments, the control circuit 502 of the integrated circuit 500 can be implemented with, but is not limited to, the control circuit 100 of FIG. 1 or the control circuit 200 of FIG. 2. In addition, the control circuit 502 can operate and be implemented in any manner similar to that described herein, but is not limited to such. Moreover, the integrated circuit 500 can operate and be implemented in any manner similar to that described herein, but is not limited to such.

Within the present embodiment, the integrated circuit 500 can include, but is not limited to, an input voltage supply pin ($V_{IN}$) 506, an enable (EN) pin 508, an output pin 510, the control circuit 502, the additional circuitry 504, the load switch 518, and pins 512, 514, and 516. In an embodiment, it is noted that the additional circuitry 504 can perform one or more operations and functions of the integrated circuit 500. Additionally, in one embodiment, note that the pins 512, 514, and 516 coupled to the additional circuitry 504 can be incorporated in the one or more operations and functions of the integrated circuit 500. It is pointed out that the additional circuitry 504 can be implemented in a wide variety of ways. For example, in an embodiment, the additional circuitry 504 can include, but is not limited to, one or more functional circuits. In addition, in an embodiment, the additional circuitry 504 can include, but is not limited to, a buffer and/or a gate driver that can be coupled between and to the enable pin 508 and the gate of the load switch 518. In this manner, the gate of the load switch 518 can be coupled to the enable pin 508.

Within FIG. 5, the control circuit 502 can be coupled to the input voltage supply pin 506, the enable pin 508, and the output pin 510 of the integrated circuit 500. Furthermore, the additional circuitry 504 can be coupled to the input voltage supply pin 506, the enable pin 508, the output pin 510, the gate of the load switch 518, and the pins 512, 514, and 516. The drain of the load switch 518 can be coupled to the input voltage supply pin 506 while the source of the load switch 518 can be coupled to the output pin 510. It is pointed out that in various embodiments, the gate of the load switch 518 can be coupled to the enable pin 508 via one or more elements (e.g., a buffer, a gate driver, and the like) of the additional circuitry 504. Though not shown within FIG. 5, it is noted that in an embodiment, the gate of the load switch 518 can be coupled to the enable pin 508 without utilizing the additional circuitry 504.

Note that the load switch 518 can be implemented in a wide variety of ways. In an embodiment, the load switch 518 can be implemented as, but is not limited to, an N-channel MOSFET (metal-oxide semiconductor field-effect transistor) which is also known as a NMOS. In addition, in an embodiment, the load switch 518 can be implemented as, but is not limited to, a P-channel MOSFET which is also known as a PMOS. It is noted that the load switch 518 can be referred to as a switching element or as a transistor. In an embodiment, note that a gate, a drain, and a source of the load switch 518 can each be referred to as a terminal of the switch (or transistor). Furthermore, in an embodiment, the gate of the load switch 518 can also be referred to as a control terminal of the switch (or transistor).

It is understood that the integrated circuit 500 may not include all of the elements illustrated by FIG. 5. Furthermore, the integrated circuit 500 can be implemented to include one or more elements not illustrated by FIG. 5. It is pointed out that the integrated circuit 500 can be utilized or implemented in any manner similar to that described herein, but is not limited to such.

Figure 6:
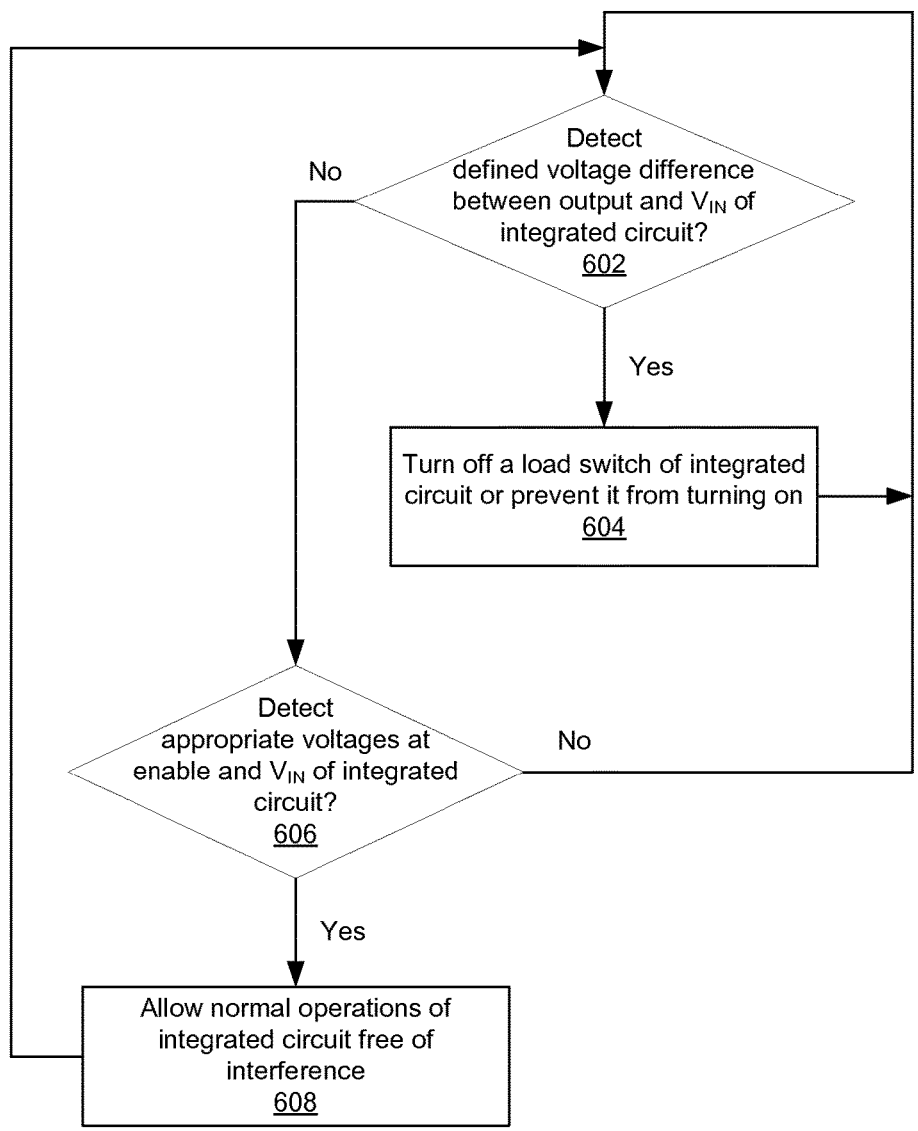
FIG. 6 is flow diagram of a method in accordance with various embodiments of the invention.

FIG. 6 is a flow diagram of a method 600 for preventing reverse conduction in a load switch of an integrated circuit (or chip or semiconductor chip) in accordance with various embodiments of the invention. Although specific operations are disclosed in FIG. 6, such operations are examples. The method 600 may not include all of the operations illustrated by FIG. 6. Also, method 600 may include various other operations and/or variations of the operations shown. Likewise, the sequence of the operations of flow diagram 600 can be modified. It is appreciated that not all of the operations in flow diagram 600 may be performed. In various embodiments, one or more of the operations of method 600 can be controlled or managed by hardware, by software, by firmware, or by any combination thereof, but is not limited to such.

At operation 602, a determination can be made as to whether a defined voltage difference is detected between an output (e.g., 110, 210, or 510) and input voltage supply ($V_{IN}$) (e.g., 102, 202, or 506) of an integrated circuit (e.g., 500). If so, method 600 proceeds to operation 604. However, if it is determined at operation 602 that the defined voltage difference has not been detected, method 600 proceeds to operation 606. It is noted that operation 602 can be implemented in a wide variety of ways. For example, operation 602 can be implemented in any manner similar to that described herein, but is not limited to such.

At operation 604 of FIG. 6, a load switch (e.g., 518) of the integrated circuit (e.g., 500) can be turned off or prevented from turning on (or being activated). In an embodiment, at operation 604, the load switch and the integrated circuit can be turned off or prevented from turning on (or being activated). Note that operation 604 can be implemented in a wide variety of ways. For example, operation 604 can be implemented in any manner similar to that described herein, but is not limited to such. While continuing to perform operation 604, method 600 proceeds to the beginning of operation 602.

At operation 606, a determination can be made as to whether appropriate voltages are detected at both an enable (e.g., 104, 204, or 508) and the input voltage supply (e.g., 102, 202, or 506) of the integrated circuit (e.g., 500). Note that in one embodiment, the load switch of the integrated circuit can be coupled to the enable and the input voltage supply of the integrated circuit. If it is determined at operation 606 that appropriate voltages have been detected, method 600 proceeds to operation 608. However, if it is determined at operation 606 that appropriate voltages have not been detected, method 600 proceeds to the beginning of operation 602. It is pointed out that operation 606 can be implemented in a wide variety of ways. For example, operation 606 can be implemented in any manner similar to that described herein, but is not limited to such.

At operation 608 of FIG. 6, normal operation of the integrated circuit is allowed to occur free of any interference by the instrumentality that performed operations 602 and 604. Note that operation 608 can be implemented in a wide variety of ways. For example, operation 608 can be implemented in any manner similar to that described herein, but is not limited to such. While continuing to perform operation 608, method 600 proceeds to the beginning of operation 602. As such, if circumstances change during normal operation of the integrated circuit, the load switch and the integrated circuit (in an embodiment) can be turned off.

In various embodiments, method 600 can prevent reverse conduction in a load switch of an integrated circuit by turning off the load switch or by preventing the load switch from turning on based on the conditions described herein. Furthermore, method 600 can prevent an integrated circuit from being unintentionally turned on in accordance with various embodiments of the invention.

The foregoing descriptions of various specific embodiments in accordance with the invention have been presented for purposes of illustration and description. They are not intended to be exhaustive or to limit the invention to the precise forms disclosed, and many modifications and variations are possible in light of the above teaching. The invention is to be construed according to the Claims and their equivalents.

What is claimed is:

1. A method comprising:
    detecting a defined voltage difference between an output and a voltage supply of an integrated circuit; and
    after said detecting, preventing said integrated circuit from turning on using a switching element that couples an enable input of said integrated circuit to ground, a resistance comprising first and second terminals, said first terminal being coupled to a control terminal of said switching element and said second terminal being coupled to said ground.

2. The method of claim 1, wherein said switching element comprises a transistor.

3. The method of claim 1, wherein said detecting is performed by another switching element coupled to said output and said voltage supply.

4. The method of claim 3, further comprising:
    detecting a voltage at both said voltage supply and said enable input.

5. The method of claim 4, further comprising:
    after said detecting said voltage at both, allowing said integrated circuit to operate free of interference by said switching element.

6. The method of claim 1, wherein said switching element comprises a body that is coupled to said ground.

7. The method of claim 6, wherein said detecting is performed by another switching element coupled to said output and said voltage supply.

8. The method of claim 1, wherein said preventing comprises preventing a load switch of said integrated circuit from turning on.

9. A method comprising:
    detecting a defined voltage difference between an output pin and a voltage supply pin of an integrated circuit; and
    after said detecting, preventing said integrated circuit from turning on using a switching element that couples an enable pin of said integrated circuit to ground, a resistance comprising first and second terminals, said first terminal being coupled to a control terminal of said switching element and said second terminal being coupled to said ground.

10. The method of claim 9, wherein said switching element comprises a transistor.

11. The method of claim 9, wherein said detecting is performed by another switching element coupled to said output pin and said voltage supply pin.

12. The method of claim 11, further comprising:
    detecting a voltage at both said voltage supply pin and said enable pin.

13. The method of claim 12, further comprising:
    after said detecting said voltage at both, allowing said integrated circuit to operate free of interference by said switching element.

14. The method of claim 9, wherein said preventing comprises preventing a load switch of said integrated circuit from turning on.

15. A method comprising:
    detecting a defined voltage difference between an output and a voltage supply of a semiconductor chip; and
    after said detecting, preventing said semiconductor chip from turning on using a switching element that couples an enable input of said semiconductor chip to ground, a resistance comprising first and second terminals, said first terminal being coupled to a control terminal of said switching element and said second terminal being coupled to said ground.

16. The method of claim 15, wherein said switching element comprises a transistor.

17. The method of claim 16, wherein said detecting is performed by another transistor coupled to said output and said voltage supply.

18. The method of claim 15, further comprising:
   detecting a voltage at both said voltage supply and said enable input of said semiconductor chip.

19. The method of claim 18, further comprising:
   after said detecting said voltage at both, allowing said semiconductor chip to operate free of interference by said switching element.

20. The method of claim 15, wherein said preventing comprises preventing a load switch of said semiconductor chip from turning on.

\* \* \* \* \*